United States Patent
Engel et al.

(10) Patent No.: US 10,679,849 B2
(45) Date of Patent: Jun. 9, 2020

(54) ELECTRIC FIELD ASSISTED PLACEMENT OF NANOMATERIALS THROUGH DIELECTRIC ENGINEERING

(71) Applicant: INTERNATIONAL BUSINESS MACHINES CORPORATION, Armonk, NY (US)

(72) Inventors: Michael Engel, Rio de Janeiro (BR); Mathias B. Steiner, Rio de Janeiro (BR); Jaione Tirapu Azpiroz, Rio de Janeiro (BR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/539,071

(22) Filed: Aug. 13, 2019

(65) Prior Publication Data

US 2019/0371603 A1 Dec. 5, 2019

Related U.S. Application Data

(63) Continuation of application No. 15/362,191, filed on Nov. 28, 2016, now Pat. No. 10,431,453.

(51) Int. Cl.
| | |
|---|---|
| *H01L 51/00* | (2006.01) |
| *H01L 21/02* | (2006.01) |
| *H01L 51/10* | (2006.01) |
| *B82Y 40/00* | (2011.01) |

(52) U.S. Cl.
CPC .... *H01L 21/02376* (2013.01); *H01L 51/0023* (2013.01); *H01L 51/0048* (2013.01); *H01L 51/102* (2013.01); *B82Y 40/00* (2013.01); *H01L 51/0045* (2013.01); *Y10S 977/742* (2013.01)

(58) Field of Classification Search
None
See application file for complete search history.

(56) References Cited

U.S. PATENT DOCUMENTS

| | | | | |
|---|---|---|---|---|
| 5,580,825 | A * | 12/1996 | Labunov | H01L 21/31687 438/635 |
| 8,629,010 | B2 * | 1/2014 | Avouris | B82Y 10/00 257/E51.04 |
| 8,859,439 | B1 | 10/2014 | Avouris et al. | |

(Continued)

OTHER PUBLICATIONS

Dong, L. et al., "Floating-Potential Dielectrophoresis-Controlled Fabrication of Single-Carbon-Nanotube Transistors and Their Electrical Properties" J. Phys. Chem. B (Jun. 2005) pp. 13148-13153, vol. 109.

(Continued)

*Primary Examiner* — Bradley Smith
(74) *Attorney, Agent, or Firm* — Tutunjian & Bitetto, P.C.; Joseph Petrokaitis

(57) ABSTRACT

A method of positioning nanomaterials includes patterning guiding dielectric features from a single layer of guiding dielectric material, and producing an electric field by at least one electrode disposed on a substrate that is attenuated through the guiding dielectric features to create an attractive dielectrophoretic force that guides at least one nanostructure abutting the guiding dielectric features to be positioned on a deposition surface of the substrate.

20 Claims, 7 Drawing Sheets

(56) References Cited

U.S. PATENT DOCUMENTS

2008/0296563 A1* 12/2008 Bourgoin .............. B82Y 10/00
257/40
2011/0156109 A1   6/2011 Gazit et al.

OTHER PUBLICATIONS

Ganzhorn, M. et al., "A Scalable, CMOS-Compatible Assembly of Ambipolar Semiconducting Single-Walled Carbon Nanotube Devices" Advanced Materials (Feb. 2011) pp. 1734-1738, vol. 23.
Stokes, P. et al., "Local-gated single-walled carbon nartotube field effect transistors assembled by AC dielectrophoresis" Nanotechnology (Mar. 2008) pp. 1-5, vol. 19.
Vijayaraghavan, A. et al., "Ultra-Large-Scale Directed Assembly of Single-Walled Carbon Nanotube Devices" Nano Letters (Feb. 2007) pp. 1558-1560, vol. 7, No. 6.

* cited by examiner

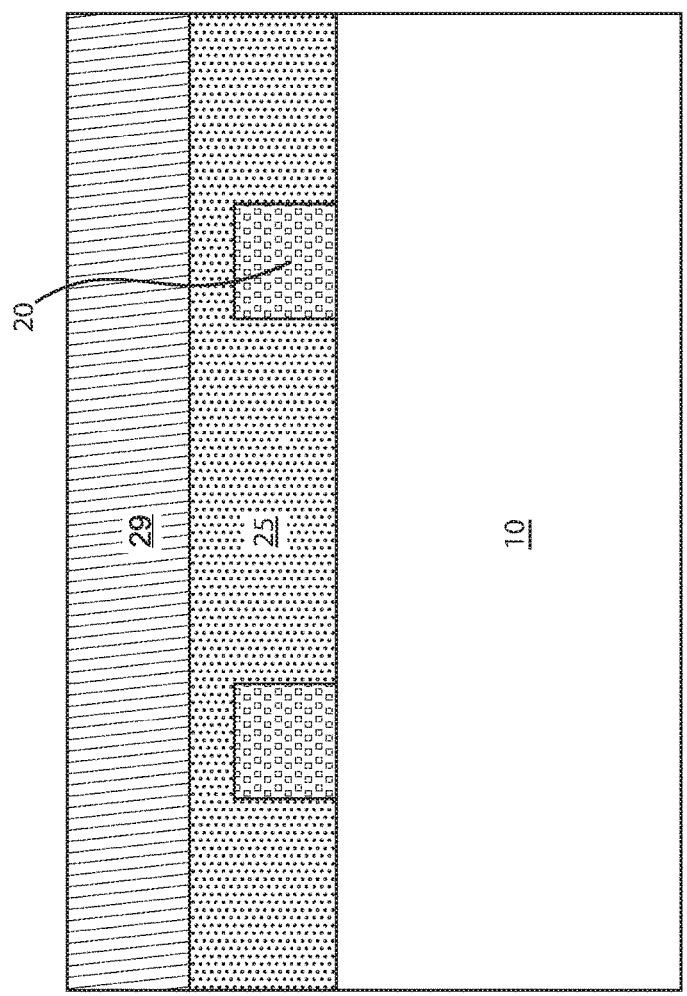
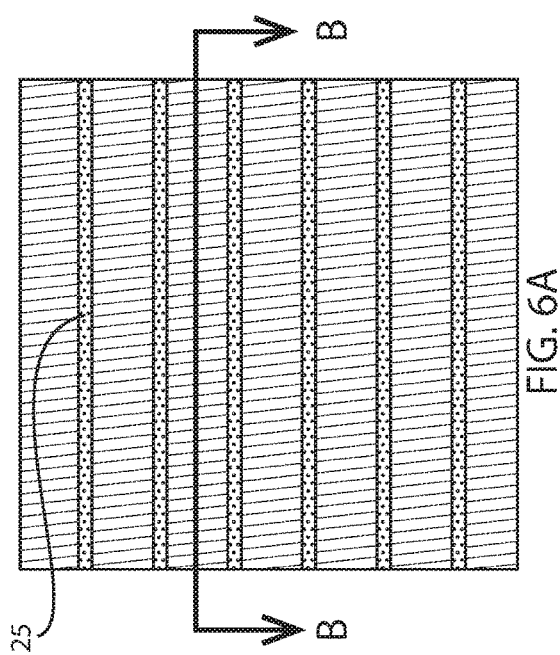
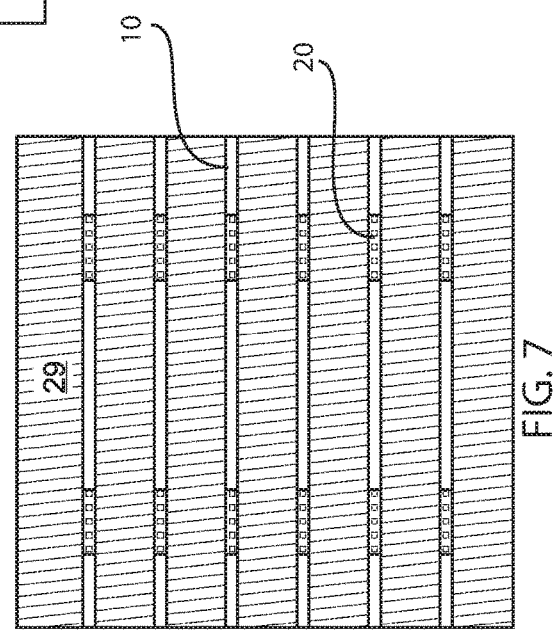
FIG. 6B
FIG. 6A
FIG. 7

US 10,679,849 B2

ELECTRIC FIELD ASSISTED PLACEMENT OF NANOMATERIALS THROUGH DIELECTRIC ENGINEERING

BACKGROUND

Technical Field

The present invention generally relates to nanomaterials, and more particularly to methods of controlling the orientation of nanomaterials.

Description of the Related Art

Nanomaterials have been successfully used as functional building blocks to fabricate multi-dimensional (D) ordered assemblies with potential applications in nanoelectronic and optic devices. Examples of nanomaterials include nanowires, nanotubes, nanoparticles, nanocrystals and nanosheets. Orientating nanomaterials in efforts to form structures, such as those used in nanoelectronic and optical devices, can include solution based methods. Some examples of placement methods rely on substrate patterning, chemical surface functionalization, Langmuir-Blodgett type techniques, or a combination thereof. The control of the nanomaterial position, orientation and density is substantially limited using the aforementioned methods.

SUMMARY

In accordance with an embodiment, a method of positioning nanomaterials is provided using electronic field and a guiding dielectric layer. In one embodiment, the method of positioning the nanomaterials includes forming guiding dielectric structures from a single material layer on a substrate including at least one electrode, wherein an exposed portion of the substrate between the dielectric guide features provides a deposition surface. The method further includes producing an electric field by the electrodes to create an attractive force that guides at least one nanostructure to the deposition surface but is attenuated through the dielectric guide features.

In another embodiment, the method includes forming a set of electrodes on a substrate; and covering the electrodes and substrate with a single layer of guiding dielectric material. The guiding material is then patterned to provide dielectric guide features, wherein an exposed portion of the substrate between the dielectric guide features provides a deposition surface. The guiding dielectric features and the deposition surface are submerged in a liquid medium containing at least one nanostructure. An electric field produced by the electrodes that is attenuated by the dielectric guide features creates an attractive force that, guides the nanostructures to the deposition surface.

In yet another embodiment, the method of positioning nanomaterials may include forming a set of electrodes on a substrate; and covering the electrodes and the substrate with a single layer of guiding dielectric material. The single layer of guiding dielectric material is patterned to pro dielectric guide features, wherein an exposed portion of the substrate between the dielectric guide features provides a deposition surface. An electric field produced by the electrodes that is attenuated by the dielectric guide features creates an attractive force that guides at least one nanostructure to the deposition surface.

In yet another embodiment, a method of positioning nanomaterials is provided. The method includes patterning guiding dielectric features from a single layer of guiding dielectric material, and producing an electric field by at least one electrode disposed on a substrate that is attenuated through the guiding dielectric features to create an attractive dielectrophoretic force that guides at least one nanostructure abutting the guiding dielectric features to be positioned on a deposition surface of the substrate.

In yet another embodiment, a method of positioning nanomaterials is provided. The method includes forming a set of electrodes on a substrate, covering the set of electrodes and the substrate with a single layer of guiding dielectric material, patterning the single layer of guiding dielectric material to form dielectric guide features, applying a liquid medium containing at least one nanostructure to the guiding dielectric features and the deposition surface, and producing an electric field by the set of electrodes that is attenuated by the dielectric guide features to create a dielectrophoretic attractive force that guides the at least one nanostructure to a deposition surface of the substrate without positioning the at least one nanostructure atop the dielectric; guide features.

In yet another embodiment, a method of positioning nanomaterials is provided. The method includes covering a substrate and a set of electrodes formed on the substrate with a single layer of guiding dielectric material, patterning the single layer of guiding dielectric material to form dielectric guide features, and producing an electric field by the set of electrodes that is attenuated by the dielectric guide features to create an attractive force that guides at least one nanostructure to a deposition surface of the substrate without positioning the at least one nanostructure atop the dielectric guide features.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 6A is a top down view illustrating forming a second mask on the single dielectric layer that is depicted in FIG. 5, in accordance with one embodiment of the present disclosure.

FIG. 6B is a side cross-sectional view along section line B-B of the structure depicted in 6A.

FIG. 7 is a top down view depicting etching the single dielectric layer using the second mask as an etch mask to provide dielectric guiding features that in combination with an electric field provide an attractive force that can orientate nanostructures, in accordance with one embodiment of the present disclosure.

DETAILED DESCRIPTION

Figure 1A:
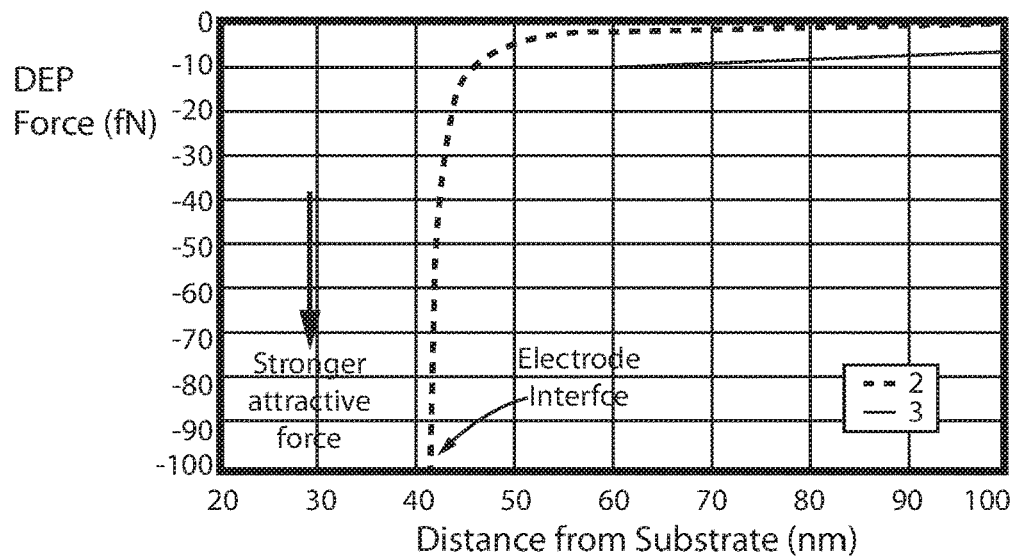
FIG. 1A is a plot of the attractive (DEP) force as a function of the distance to the substrate from samples including a dielectric layer overlying an electrode, and a comparative sample that does not include the dielectric layer, in accordance with one embodiment of the present disclosure.

Detailed embodiments of the claimed structures and methods are disclosed herein; however, it, is to be understood that, the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein provide for an electric field assisted placement of nanomaterials through dielectric engineering. The methods and structures described herein provide for the solution based, aligned placement of nanomaterials, nanowires, nanotubes, nanocrystals, nanosheets and combinations thereof, on an insulating (also referred to as dielectric) substrate. Prior methods for nanomaterial placement, such as those that rely on substrate patterning, chemical surface functionalization, Langmuir-Blodgett-type techniques or other related techniques, are limited in their control of nanomaterial position, orientation and density.

It has further been determined that electric field driven assembly methods, or dielectrophoresis, require precise patterning of metallic electrodes for the application of an electric field at the location where the nanomaterial assembly should occur. The methods and structures disclosed herein overcome the aforementioned limitations by employing a simple, metallic contact layout combined with a single dielectric layer designed to achieve assembly of the nanomaterials with nanometer precision. As will be described in further detail below, in some embodiments, the methods and structures described herein combine standard semiconductor processing steps, i.e., lithography, dielectric and metal thin film deposition processing steps; and an etch process step, in order to place nanometer scale material with nanometer precision based on electric field assisted assembly.

Figure 1B:
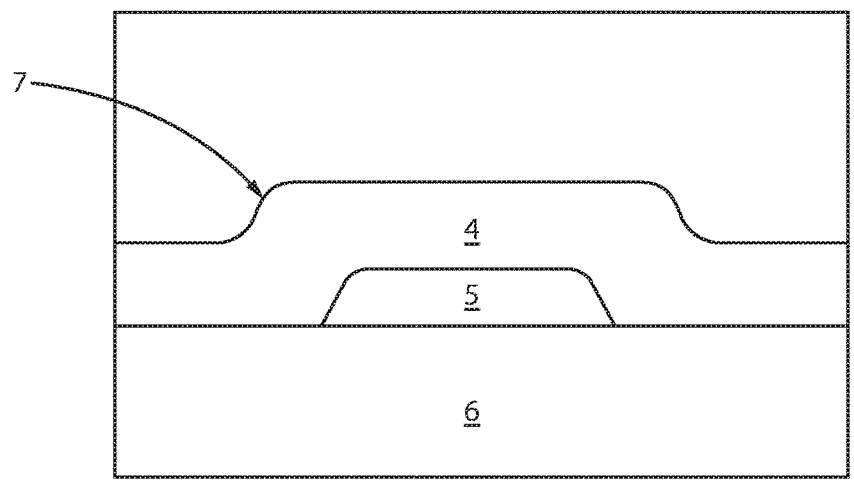
FIG. 1B is a side cross-sectional view of an experimental sample including a dielectric layer overlying an electrode, which provided at least one data point depicted in FIG. 1A.
Figure 1C:
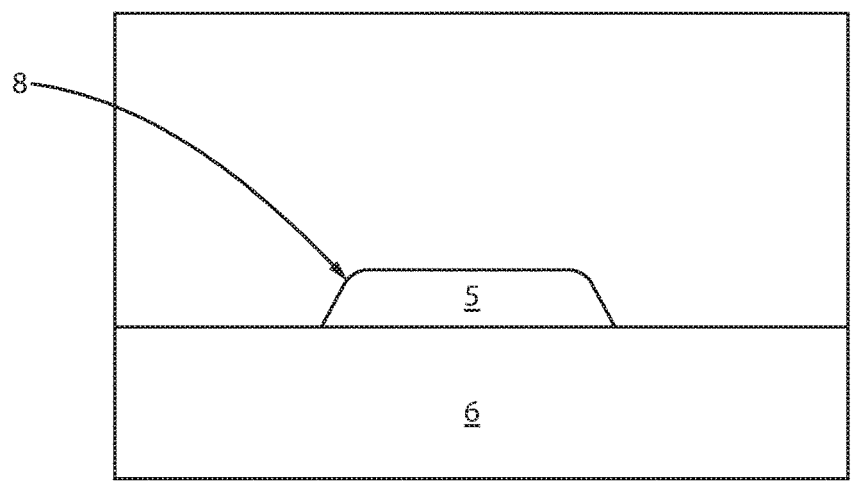
FIG. 1C is a side cross-sectional view of a comparative sample that does not include the dielectric layer, which provided at least one data point depicted in FIG. 1A.

FIGS. 1A-1C outline the basic working principle of the methods and structures that are described herein for providing electric field assisted placement of nanomaterials through dielectric engineering. It has been determined that attractive dielectrophoretic (DEP) forces generated by metallic leads decrease, i.e., fall off, exponentially above a dielectric substrate surface. DEP is a phenomenon in which a force is exerted on a dielectric particle when it is subjected to a non-uniform electric field. This force does not require the particle to be charged. Typically, the strength of the force depends on the medium and particles' electrical properties, on the particles' shape and size, as well as on the frequency of the electric field. Consequently, fields of a particular frequency can manipulate particles with selectivity. Therefore, the resulting force exerted on a nanostructure is uniquely determined by design of the dielectric layer. This is illustrated in FIGS. 1A-1C.

FIG. 1A is a plot of the attractive DEP force as a function of the distance to the substrate from samples including a dielectric material layer overlying an electrode, as depicted in FIG. 1B, and a comparative sample that does not include the dielectric material layer, as depicted in FIG. 1C. Referring to FIG. 1B, the dielectric material layer, e.g., aluminum oxide material layer, identified by reference number 4 is present over an electrode identified by reference number 5. The electrode is composed of an electrically conductive material, such as copper (Cu) or aluminum (Al). The electrode identified by reference number 5 is present on a substrate that is identified by reference number 6. The substrate may be a semiconductor substrate, such as a silicon (Si) substrate. Referring to FIG. IC, the comparative sample is similar to the sample depicted in FIG. 1B, and includes a similar electrode 5 and substrate 6, but does not include the dielectric layer 4. Both the comparative sample depicted in FIG. 1C and the sample depicted in FIG. 1B are submerged in a toluene based solvent. Measurements of the attractive (DEP) force where taken from the top topography corner 7 of the dielectric material layer 4 of the sample depicted in FIG. 1B. Measurements of the attractive (DEP) force where taken from the top corner 8 of the electrode 5 of the comparative sample depicted in FIG. 1C.

Referring to FIG. 1A, the data line for the attractive (DEP) force provided by the sample including the dielectric material layer overlying the electrode is identified by reference number 3, and the data line for the attractive (DEP) force provided by the comparative sample that does not include the dielectric material layer is identified by reference number 2. From the data plotted in FIG. 1A, for realistic dielectric layer thicknesses, e.g., 5 nm to 100 nm, the force difference exerted on nanostructures at the same lateral and vertical position with and without dielectric layer can be on the order of 1:100. Therefore, nanomaterials only "feel" an attractive force in regions without dielectric layer, e.g., aluminum oxide material layer as illustrated in the comparison of FIGS. 1B and 1C with the data plotted in FIG. 1A. It has been determined that in some embodiments the placement of nanostructures can be precisely tailored by proper design of a single dielectric layer. The methods and structures of the present disclosure are now described with greater detail referring to FIGS. 2-10B.

Figure 2A:
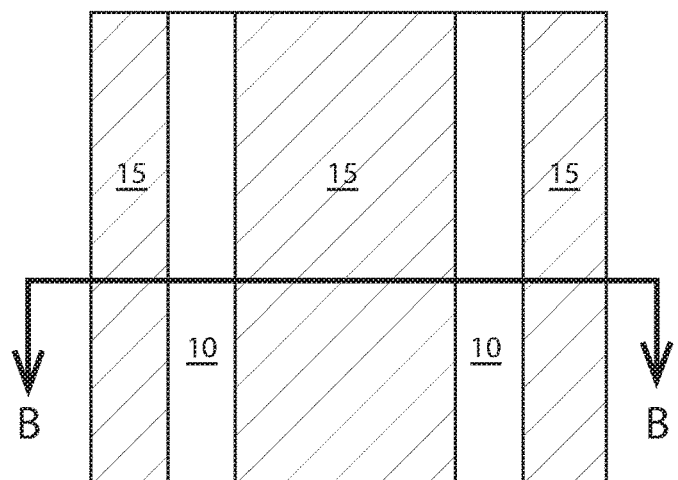
FIG. 2A is a top down view depicting forming a first mask on a substrate, wherein the mask is patterned to provide the geometry of electrodes, in accordance with an embodiment of the present invention.
Figure 2B:
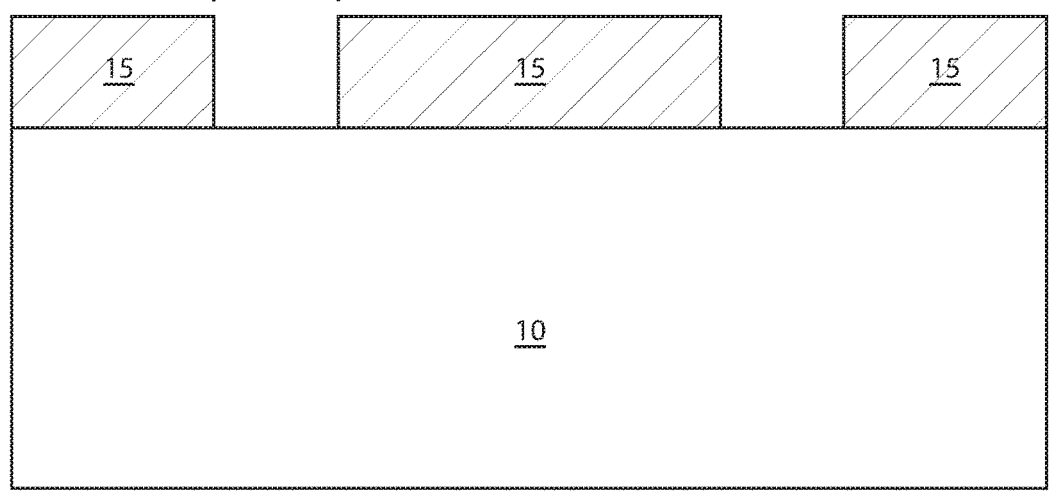
FIG. 2B is a side cross-sectional view along section line B-B of FIG. 2A.

FIGS. 2A and 2B depict one embodiment of a patterning method as part of a process for forming contact leads. In some embodiments, the method may include forming a mask 15 atop a substrate 10. The substrate 10 may be composed of a semiconductor or dielectric material. For example, the substrate 10 may be composed of a type IV or type III-V semiconductor. For example, the substrate 10 may be composed of a type IV semiconductor, such as silicon, silicon germanium and/or germanium. The substrate 10 may also be composed of a type semiconductor material. In some examples, described herein, the supporting substrate is composed of silicon (Si). Although the substrate 10 is depicted as being a bulk substrate, in some other examples, the substrate 10 may also be provided by a semiconductor, e.g., silicon, on insulator (SOI) substrate. In some embodiments, when the substrate 10 is composed of a dielectric material, the substrate 10 may be composed of glass, silicon oxide, aluminum oxide and combinations thereof. In some embodiments, the substrate 10 is composed of a polymer type material. In some examples, the substrate 10 is composed of glass, quartz, silicon carbide, silicon nitride ($Si_3N_4$) and combinations thereof.

Forming the first mask 15 on the substrate 10 may include deposition, photolithography, and development process steps. First, a photoresist material layer is blanket deposited atop an entire upper surface of the substrate 10. Thereafter, the photoresist material layer is patterned to provide the first mask 15. Specifically, a pattern is produced by applying a photoresist to the surface to be etched; exposing the photoresist to a pattern of radiation; and then developing the pattern into the photoresist utilizing conventional resist developer, wherein a portion f the photoresist layer may dissolve and a portion of the photoresist mask remains to provide the first mask 15. It is noted that this is only one example for forming a first mask 15, and other methods of forming a first mask 15 are equally applicable to the present disclosure. For example, the mask can be a soft mask, like optical or electron-beam lithography resist (e.g., poly(methyl methacrylate) (PMMA), hydrogen silsesquioxane (HSQ), or S1818™ available from DOW®. In another example, a hard mask, like an oxide, nitride, or metal deposited by a compatible deposition method. The first masking 15 is patterned to provide the geometry of electrically conductive features 20. More specifically, the openings 16 in the mask 14 may provide the geometry of the electrically conductive features 20. The electrically conductive features 20 may be formed in accordance with lift off methods, as described below. The electrically conductive features 20 may provide electrodes that are present on an upper surface of a substrate 10.

Figure 3:
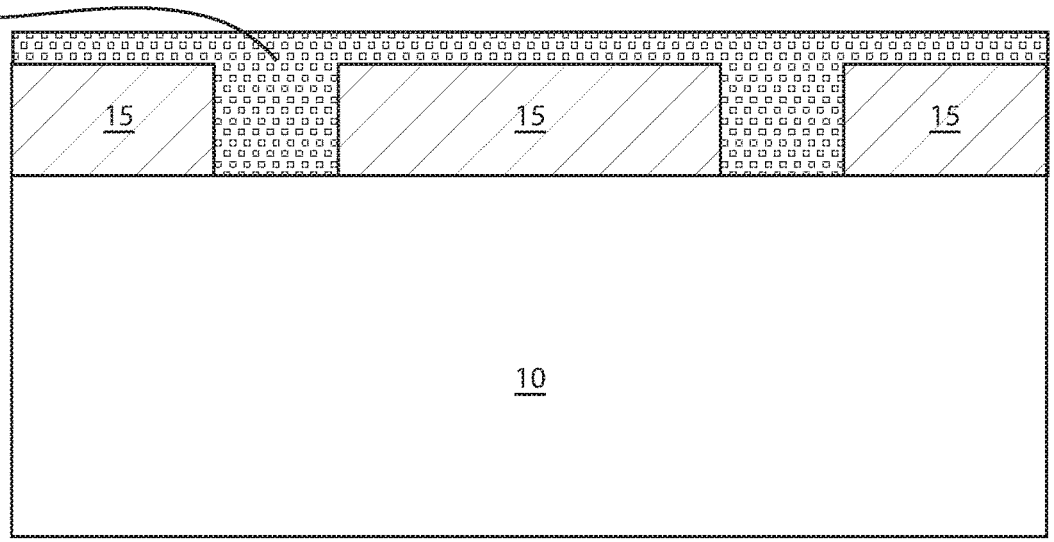
FIG. 3 is a side cross-sectional view illustrating one embodiment of forming an electrically conductive material that is present within the openings that are present in the first masking.

FIG. 3 illustrates one embodiment of forming an electrically conductive material 20 that is present at least within the openings that, are present in the masking 15. The term "electrically conductive" as used through the present disclosure means a material typically having a room temperature conductivity of greater than $10^{-8}(-m)^{-1}$. Examples of electrically conductive materials for the electrically conductive material 20 include metals, metal nitrides, metal semiconductor alloys, e.g., silicides, and doped semiconductor, e.g., n-type doped polysilicon. Examples of metals for the electrically conductive material 20 include copper (Cu), aluminum (Al), titanium (Ti), tungsten (W), tantalum (Ta), silver (Ag), gold (Au) and combinations thereof.

The electrically conductive material 20 may be deposited on the masking 15 and within the openings 16 in the masking 15 using a deposition process, such as physical vapor deposition (PVD), chemical vapor deposition (CND), atomic layer deposition (ALD) or plating. The PVD method for forming the electrically conductive material 20 may include sublimation, evaporation, sputtering and combinations thereof. Examples of sputtering apparatus that may be suitable for depositing electrically conductive material 20 include DC diode type systems, radio frequency (RF) sputtering, magnetron sputtering, and ionized metal plasma (IMP) sputtering. The CVD method for forming the electrically conducive material 20 include, but are not limited to, atmospheric pressure (APCVD), low pressure (LPCVD), plasma enhanced (PECVD), metal organic (MOCVD), and combinations thereof. The plating methods for forming the electrically conductive material 20 may include electroplating or electroless plating.

Figure 4A:
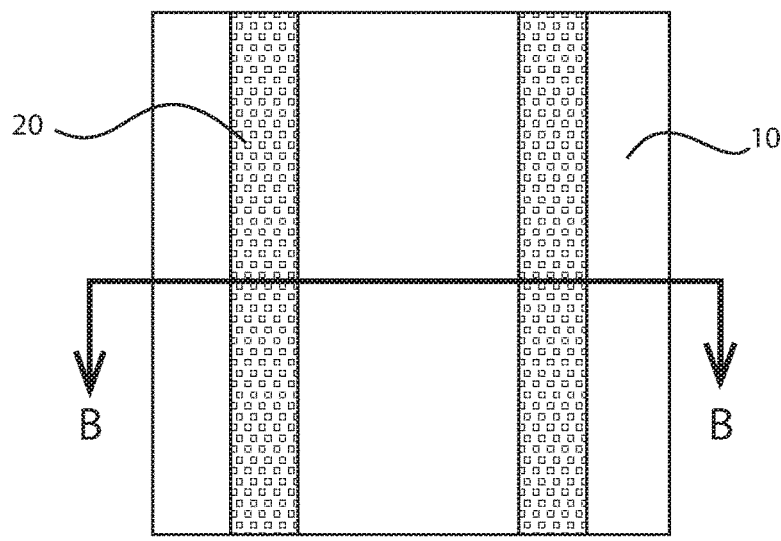
FIG. 4A is a top down view illustrating one embodiment of a lift off method for removing the masking depicted in FIG. 3, in accordance with the present disclosure.
Figure 4B:
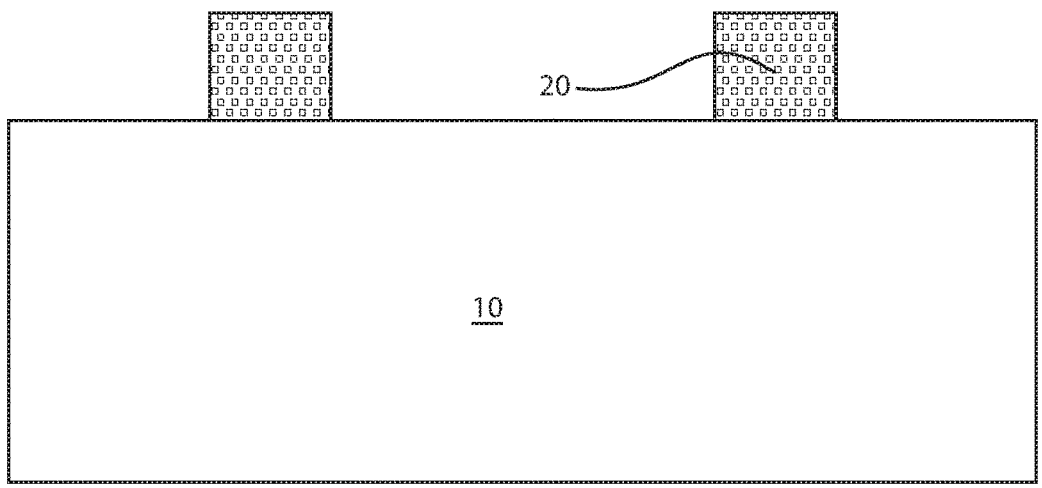
FIG. 4B is a side cross-sectional view along section line B-B of FIG. 4A.

FIGS. 4A and 4B illustrate one embodiment of a lift off method for removing the masking 15. By removing the mask 15, the portion of the electrically conductive material 20 that is present on the upper surface of the mask 15, i.e., not present in the openings 16 in the mask, is also removed. The portion of the electrically conductive material 15 that was formed in the openings 16 in the mask 15 directly on the substrate 10 remains after the lift off process to provide electrodes.

Figure 5:
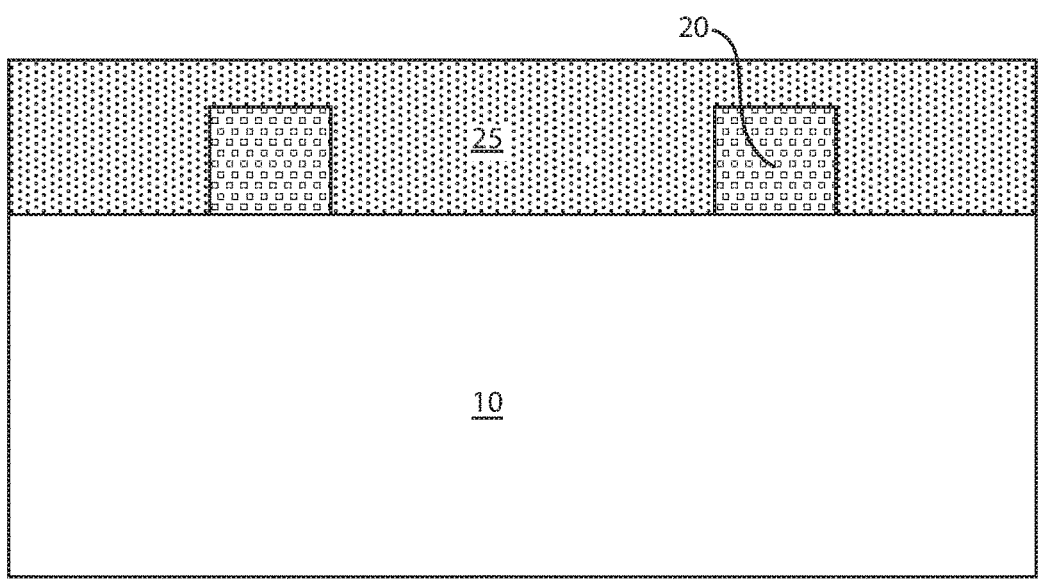
FIG. 5 is a side cross-sectional view depicting forming a single dielectric layer over the electrodes depicted in FIGS. 4A and 4B.

FIG. 5 depicts one embodiment of forming a single dielectric layer 25 over the electrodes 20 depicted in FIGS. 4A and 4B. The single dielectric layer 25 may be composed of any dielectric material, such as an oxide, nitride or oxynitride material layer. For example, the dielectric material for the single dielectric layer 25 may be silicon oxide ($SiO_2$), aluminum oxide ($Al_2O_3$) and hafnium oxide ($HfO_2$). It is noted that the above examples are provided for illustrative purposes only. For example, the dielectric material for the single dielectric layer 25 may be organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ)), and combinations thereof. In another example, the single dielectric layer 25 may be hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In yet another example, the single dielectric layer 25 may be selected from the group consisting of zirconium oxide ($ZrO_2$), aluminum oxide ($Al_2O_3$), hafnium silicate (HfSiO), nitrided hafnium silicate (HfSiON), hafnium oxynitride ($HfO_xN_y$), lanthanum oxide ($La_3O_2$), lanthanum aluminate ($LaAlO_3$), zirconium silicate ($ZrSiO_x$) and combinations thereof.

The single dielectric layer 25 may be deposited using atomic layer deposition (ALD), chemical vapor deposition (CVD), thermal evaporation or a combination thereof. In some embodiments, the single dielectric layer 25 may be deposited using a chemical vapor deposition (CVD) process selected from atmospheric pressure (APCVD), low pressure (LPCVD), plasma enhanced (PECVD), metal organic (MOCVD), and combinations thereof. The single dielectric layer 25 may be deposited to a thickness ranging from 5 nm to 100 nm. In another embodiment, the single dielectric layer 25 may be deposited to a thickness ranging from 10 nm to 50 nm.

In some embodiments, after depositing the single dielectric layer 25 the upper surface of the deposited material layer may be planarized to provide a planar upper surface. For example, the upper surface of the single dielectric layer 25 may be planarized using grinding or chemical mechanical planarization (CMP).

The term "single" as used to describe the single dielectric layer 25 denotes that only one material layer is used to provide the guiding dielectric features 25'. The single dielectric layer 25 typically has a single composition.

FIGS. 6A and 6B depict one embodiment of forming a second mask 29. The second mask 29 is patterned to provide an etch mask for etching the single dielectric layer 25 to provide guiding dielectric features 25'. In some examples, the second mask 29 may be patterned by optical/electron beam lithography or direct laser writing.

In one example, forming the second mask 29 on the single dielectric layer 25 may include deposition, photolithography, and development process steps. First, a photoresist material layer is blanket deposited atop an entire upper surface of the single dielectric layer 25. Thereafter, the photoresist material layer is patterned to provide the second mask 29. Specifically, a pattern is produced by applying a photoresist to the surface to be etched; exposing the photoresist to a pattern of radiation; and then developing the pattern into the photoresist utilizing conventional resist developer, wherein a portion of the photoresist layer may dissolve and a portion of the photoresist mask remains to provide the second mask 29. It is noted that this is only one example for forming a second mask 29, and other methods of forming a second mask 29 are equally applicable to the present disclosure. For example, the mask can be a soft mask, like optical or electron-beam lithography resist (e.g., poly(methyl methacrylate) (PMMA), hydrogen silsesquioxane (HSQ), or S1818™ available from DOW®. In another example, a hard mask, like an oxide, nitride, or metal deposited by a compatible deposition method. The second mask 29 is patterned to provide the geometry of the guiding dielectric features 25'. More specifically, the openings in the second mask 29 expose the portions of the single dielectric layer 25 that are removed to expose the underlying substrate 10, which provide the deposition surface for the later orientated nanostructures. The guiding dielectric features 25' are used in combination with an electric field produced by the electrically conducive features 20, e.g., electrodes, to provide an attractive force that, orientates nanostructures to the deposition surfaces on the substrate 10 between the guiding features 25'.

FIG. 7 depicts etching the single dielectric layer 25 using the second mask 29 as an etch mask to provide dielectric guiding features 25' that in combination with an electronic field provide an attractive force that can orientate nanostructures 30. The etch process for etching the single dielectric layer 25 may be an anisotropic etch process. As used herein, an "anisotropic etch process" denotes a material removal process in which the etch rate in the direction normal to the surface to be etched is greater than in the direction parallel to the surface to be etched. The anisotropic etch way include reactive ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

In one embodiments, the etch process for etching the single dielectric layer 25 may remove the dielectric material of the single dielectric layer 25 selectively to the second mask 29, the substrate 10 and the electrodes 20. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater.

In some other examples, the single dielectric layer 25 may be etched using argon sputtering.

FIGS. 8A-8D depicting the structure illustrated in FIG. 7 after removing the second mask 29 to expose the dielectric guiding features 25'. The second mask 29 may be removed by a selective etch process, or by a chemical strip process.

Figure 8A:
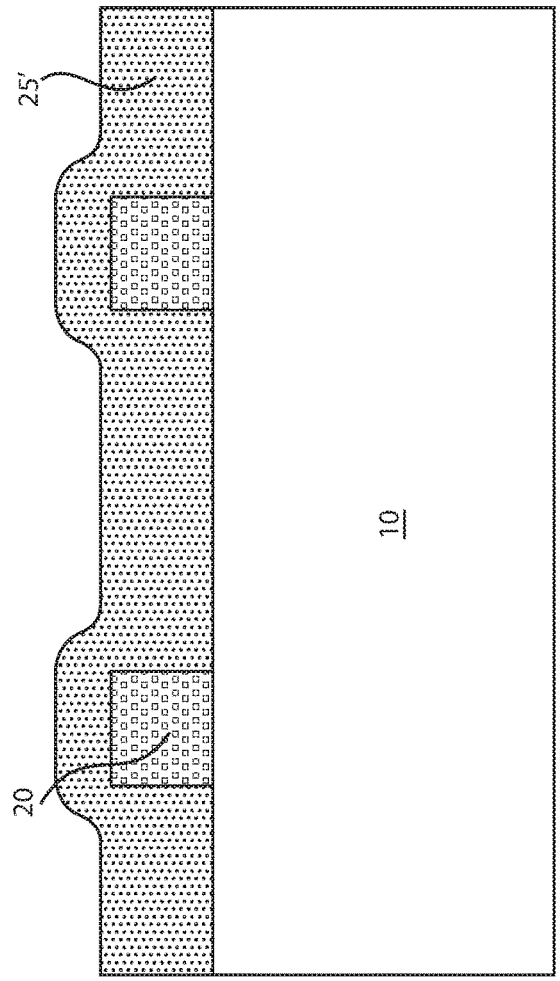
FIG. 8A is a top down view depicting the structure illustrated in FIG. 7 after removing the second mask to expose the dielectric guiding features, in accordance with one embodiment of the present disclosure.

FIG. 8A depicts one embodiment of the dielectric guiding features 25' that can be formed in accordance with this method. The space between adjacent dielectric guiding features 25' exposes a deposition surface of the substrate 10, and the pitch and distance of the voids, i.e., space between adjacent dielectric guiding features 25', uniquely determine the density, position and orientation of the later deposited nanomaterials 20.

As illustrated in FIG. 8A, in some embodiments, the sidewalk of the adjacent dielectric guiding features 25' may be parallel to one another. In some embodiments, the distance D1 separating the sidewalks of adjacent dielectric guiding features 25' may range from 5 nm to 1000 nm. In another embodiment, the distance D1 separating the sidewalk of adjacent dielectric guiding features 25' may range from 5 nm to 1000 mm. In some embodiments, the distance separating the sidewalk of adjacent dielectric guiding features 25' is selected to contain a single nanostructure. In some embodiments, the pitch P1 separating openings between adjacent dielectric guiding features 25' may range from 10 nm to 2000 nm. The term pitch P1 denotes the center to center distance separating adjacently positioned openings. In another embodiment, the pitch P1 separating openings between adjacent dielectric guiding features 25' may range from 10 nm to 2000 nm. In some embodiments, the pitch P1 is selected to provide the pitch separating adjacently orientated nanostructures, e.g., single nanostructures.

It is noted that the above example dimensions are provided for illustrative purposes only and not intended to limit the present disclosure. For example, FIG. 8C illustrates one embodiment in which the distance separating adjacent sidewalls of the dielectric guiding features 25' and the pitch separating adjacently positioned openings between the dielectric guiding features 25' is greater than the embodiment depicted in FIG. 8A.

Figure 8B:
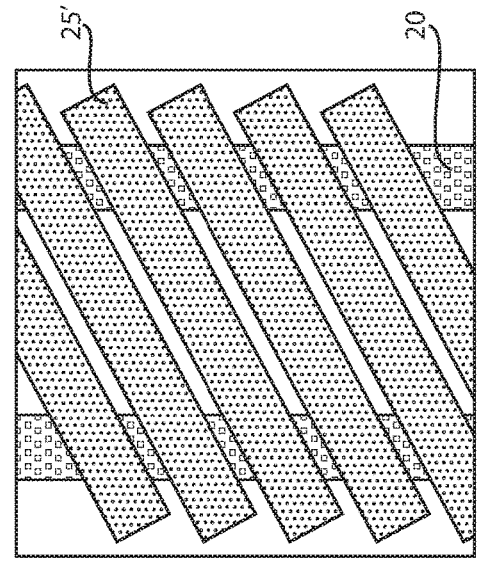
FIG. 8B is a side cross-sectional view along section line B-B of the structure depicted in FIG. 8A.
Figure 8C:
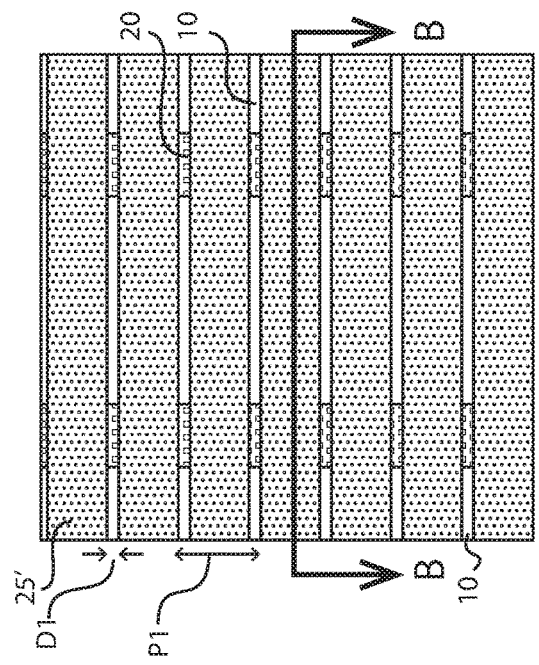
FIG. 8C is a top down view depicting another embodiment of dielectric guiding features that can be formed in accordance with the methods of the present disclosure.
Figure 8D:
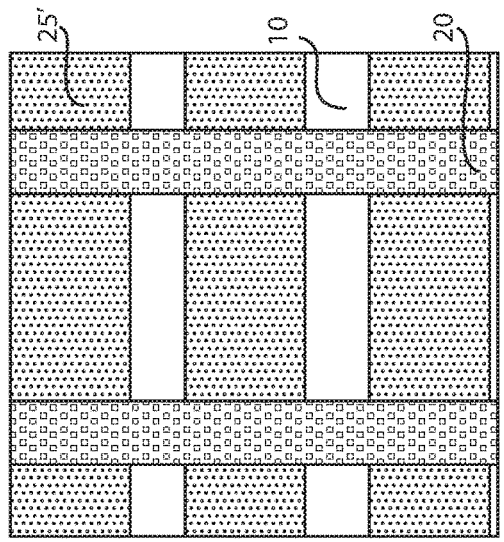
FIG. 8D is a top down view depicting yet another embodiment of the dielectric guiding features that can be formed in accordance with the methods of the present disclosure.

In the embodiments depicted in FIGS. 8A and 8C, the dielectric guiding features 25' have a length that is perpendicular to the length of the electrically conductive material 20, i.e., electrodes 20. The present disclosure is not limited to only this example. For example, the length of the dielectric guiding features 25' may be non-perpendicular to the length of the electrically conductive material 20, i.e., electrodes 20, as depicted in FIG. 8D. For example, the sidewall of the dielectric guiding features 25' may intersect with the sidewall of the electrically conductive material 20 at an angle ranging from 5° to 95°. In other examples, the sidewall of the dielectric guiding features 25' may intersect with the sidewall of the electrically conductive material 20 at an angle ranging from 15° to 85°. In yet other examples, the sidewall of the dielectric guiding features 25' may intersect with the sidewall of the electrically conductive material 20 at an angle ranging from 30° to 60°.

FIG. 8B depicts a side cross-sectional view of the structure depicted in FIG. 8A. The upper surface of the dielectric guiding feature 25' is not conformal. The upper surface of the dielectric guiding feature 25' that is depicted in FIG. 8B includes a raised portion that is overlying the electrically conductive material 20, i.e., electrode. The upper surface of the dielectric guiding feature 25' substantially conforms to the upper surface of the electrically conductive material 20, i.e., electrodes, having a geometry similar to the dielectric material 4 depicted in FIG. 1B. For example, the dielectric guiding feature 25' has a transition from the raised portion of the layer to the remaining portion of the layer that is recessed relative to the raced portion, in which the transition is proximate to the corner of the electrically conductive material 20, and the transition has a curved sidewall. The dielectric guiding feature 25' having the topography depicted in 8B is similar the topography of the dielectric layer 4 depicted in FIG. 1B; and therefore the dielectric guiding feature 25' when subjected to an electric field can produce an attractive force for orientating nanostructures similar to the attractive forces that are described above with reference to FIGS. 1A-1C.

Figure 9A:
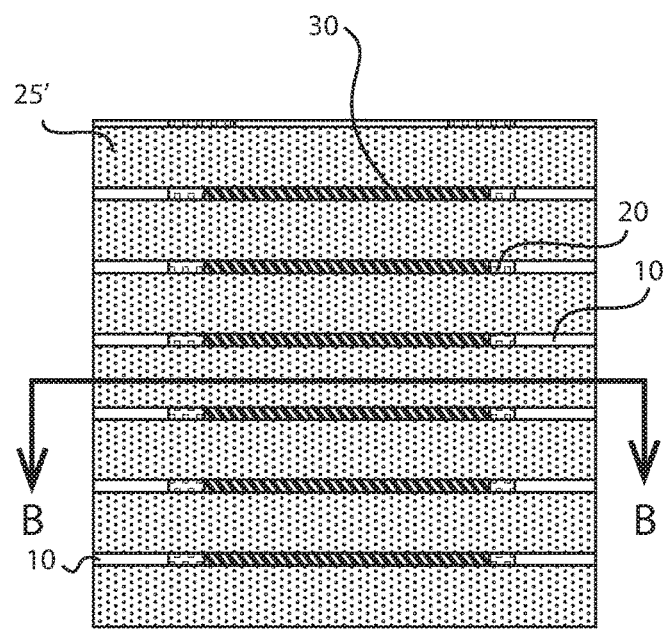
FIG. 9A is a top down view depicting the orientation of nanostructures on the deposition surface of a substrate, wherein an electric field produced by the electrodes that is attenuated by the dielectric guide features creates an attractive force that guides the nanostructures to the deposition surface, in accordance with one embodiment of the present disclosure.
Figure 9B:
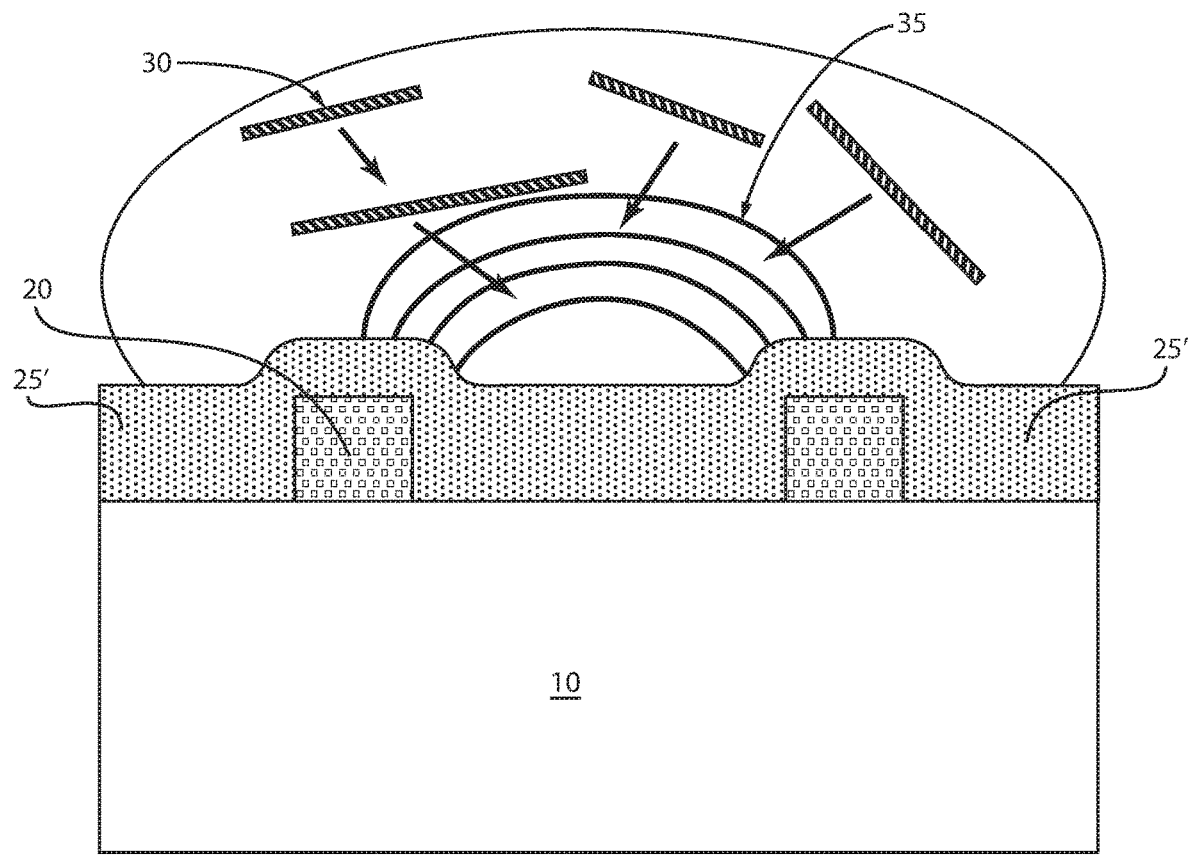
FIG. 9B is a side cross-sectional view along section line B-B of the structure depicted in FIG. 9A.

FIGS. 9A and 9B depict the orientation of nanostructures 30 on the deposition surface of a substrate 10, wherein an electric field 35 produced by the electrically conductive material 20, i.e., electrodes, transmitted through the dielectric guide features 25' creates an attractive force that guides the nanostructures 30 to the deposition surface. The term "nanostructure" denotes a material structure having one dimension, e.g., a length or width, or diameter, of less than 1 micron. One-dimensional nanostructures 30 are nanowires (nanorod) and nanotubular materials with fiber (rod, tube) lengths from 100 nm to tens of microns. Two-dimensional nanostructures 30, such as nanosheets, are films (coatings) with nanometer thickness. In some embodiments, the nanostructures 30 may be a carbon nanotube, e.g., single wall carbon nanotubes (CNT) or multi-wall carbon nanotubes (SWNT). "Nano tube" as used herein is meant to denote one form of nanostructure having an aspect ratio of length to width greater than 10. The term "nanotube" includes single wall and multi-wall nanotubes unless specifically specified as distinct. In one embodiment, a carbon nanotube is at least one graphene layer wrapped into a cylinder. In one embodiment, a single wall carbon nanotube is a graphene rolled up into a seamless cylinder with diameter of the order of a nanometer. A multi-wall carbon nanotube is a plurality of graphene sheets rolled up into a seamless cylinder with diameter of the order of a nanometer. The diameter of the carbon nanotube that may be employed as the nanostructures 30 may be equal to 1 nm or 2 nm or a value between 1 nm and 2 nm. The longest dimension of the carbon nanotube may range from about 0.5 nanometers to about 10 microns. In another embodiment, the greatest dimension of a single wall nanotube ranges from about 100 nanometers to about 10 millimeters. In one embodiment, the nanotubes used in accordance with the methods and structures disclosed herein have an aspect ratio of length, i.e., longest dimension, to width, i.e., diameter, on the order of approximately 1,000:1.

The nanostructures 30 may also be graphitic materials, such as carbon black (CB), graphitic fibers, diamond like carbon (DLC) and graphite platelets. The nanostructures 30 may be dispersed in a liquid medium, such as an aqueous medium, or an alcohol based medium to facilitate a solution-assisted deposition process that is illustrated in FIG. 9B. In other embodiments, the nanostructures 30 may be dispersed in toluene.

Still referring to FIGS. 9A and 9B, the solution of the nanostructures 30 may be applied to the dielectric guiding features 25' and the deposition surface of the substrate 10. For example, the substrate 10 may be submerged in the solution containing the nanostructures 30. Thereafter, an electric field 35 is produced by the electrodes, i.e., electrically conductive material 20. In some embodiments, producing an electric field 35 by the electrodes that is attenuated by the dielectric guide features 25' to create an attractive force that guides the nanostructures 30 to the deposition surface.

More specifically, the nanostructures 30 are attracted by the electric field that is generated between the metal electrodes 20 by applying an external voltage. The voltage can be alternative voltage (also referred to as "AC voltage") or direct voltage (also referred to as "DC voltage"), as desired. When an alternative voltage is employed, the characteristic frequency of the voltage is on a megahertz scale, e.g., from about 0.1 MHz to about 10 MHz, or from about 0.5 MHz to about 1.5 MHz, say, about 1 MHz. Other frequencies are not excluded from the scope of the present invention. The voltage can be applied for a time period of at least 1 minutes, more preferably from about 1 minutes to about 10 minutes, but other time periods are not excluded from the scope of the present disclosure.

Referring to FIG. 9A, the top view schematics visualize how the nanostructures 30 are moved into the voids of the dielectric guide features 25'. The pitch and distance of the voids in the dielectric guide features 25' uniquely determine the density, position and orientation of the nanomaterials. In the embodiment that is depicted in FIG. 9A a single nanostructure 30 that may be provided by a carbon nanotube 30 is present in each void between adjacent dielectric guide features 25'. Each nanostructure 30 may extend into contact with each electrically conductive material 20, e.g., electrode.

Figure 10A:
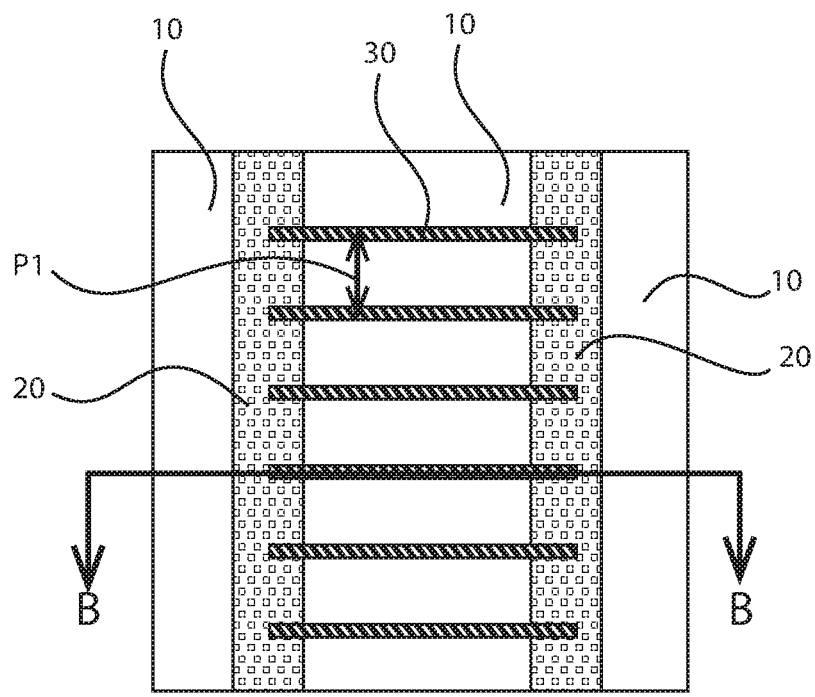
FIG. 10A is a top down view depicting removing the dielectric guide features from the structure depicted in FIGS. 9A and 9B, in accordance with one embodiment of the present disclosure.
Figure 10B:
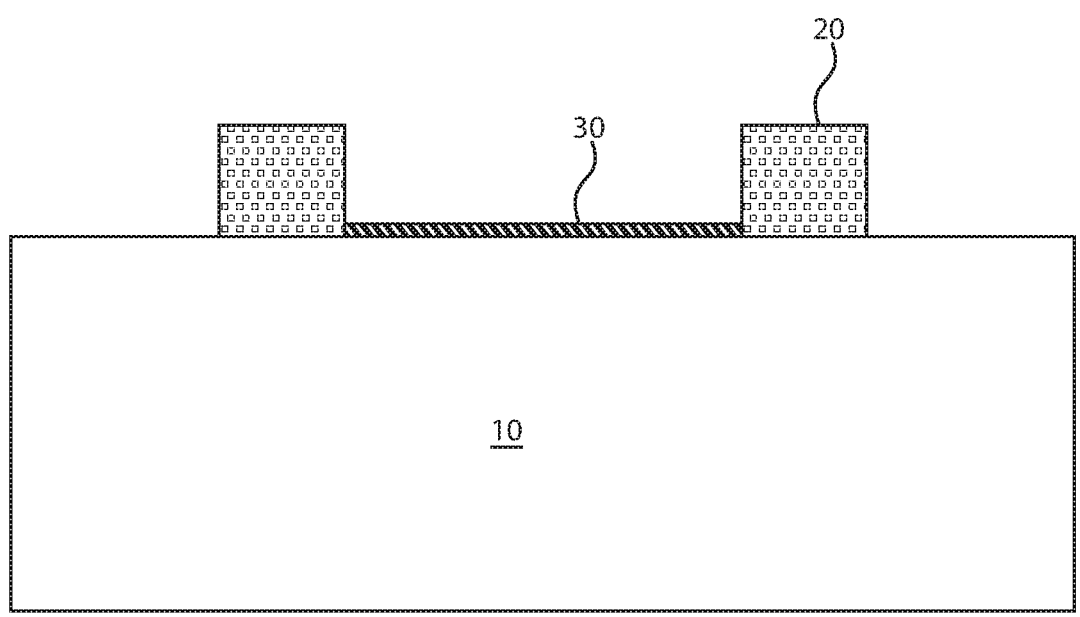
FIG. 10B is a side cross-sectional view along section line B-B of the structure depicted in FIG. 10A.

FIGS. 10A and 10B depict removing the dielectric overlayer (also referred to as guides) features 25' from the structure depicted in FIGS. 9A and 9B. The process for removing the dielectric guide features 25' may remove the dielectric over-layer features selectively to the nanostructures 30 and the electrically conductive material 20. The dielectric guide features 25' may be removed by an etch process, such as a wet chemical etch, or a dry etch, e.g., reactive ion etch (RIE) or plasma etching.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of positioning nanomaterials, comprising:
patterning guiding dielectric features from a single layer of guiding dielectric material; and
producing an electric field by electrodes disposed on a substrate, the electric field being attenuated through the guiding dielectric features to create an attractive dielectrophoretic force that guides at least one nanostructure abutting the guiding dielectric features to be positioned on a deposition surface of the substrate without being positioned directly atop the guiding dielectric features.

2. The method of claim 1, further comprising:
forming the electrodes on the substrate as a set of electrodes; and
covering the set of electrodes and substrate with the single layer of guiding dielectric material.

3. The method of claim 1, wherein the single layer of guiding dielectric material includes a material selected from the group consisting of: silicon oxide, silicon nitride, hafnium oxide, aluminum oxide, and combinations thereof.

4. The method of claim 1, further comprising applying a liquid medium containing the at least one nanostructure to the dielectric guide features and the deposition surface.

5. The method of claim 4, wherein the dielectric guide features include a dielectric material selected from the group consisting of: silicon oxide, silicon nitride, silicon oxynitride, aluminum oxide, hafnium oxide, and combinations thereof.

6. The method of claim 1, wherein the at least one nanostructure includes a structure selected from the group consisting of: carbon nanotube, nanowire, nanorod, nanosheet, carbon black (CB), graphitic fiber, diamond like carbon (DLC), and graphite platelet.

7. A method of positioning nanomaterials, comprising:
forming a set of electrodes on a substrate;
covering the set of electrodes and substrate with a single layer of guiding dielectric material;
patterning the single layer of guiding dielectric material to form dielectric guide features;
applying a liquid medium including at least one nanostructure to the guiding dielectric features and the deposition surface; and
producing an electric field by the set of electrodes, the electric field being attenuated by the dielectric guide features to create a dielectrophoretic attractive force that guides the at least one nanostructure to a deposition surface of the substrate without positioning the at least one nanostructure directly atop the dielectric guide features.

8. The method of claim 7, wherein forming the set of electrodes further includes:
forming a first mask on a surface of the substrate having openings for the set of electrodes;
blanket depositing an electrically conductive layer on the first mask, wherein the electrically conductive layer fills the openings; and
lifting the first mask.

9. The method of claim 7, wherein covering the set of electrodes and the substrate with the single layer of guiding dielectric material further includes using chemical vapor deposition.

10. The method of claim 7, wherein patterning the guiding dielectric material further includes performing photolithography and etch processes.

11. The method of claim 10, wherein the etch process includes an anisotropic etch process.

12. The method of claim 7, wherein the dielectric guide features are composed of a dielectric material selected from the group consisting of: silicon oxide, silicon nitride, silicon oxynitride, aluminum oxide, hafnium oxide and combinations thereof.

13. The method of claim 7, wherein the at least one nanostructure includes a structure selected from the group consisting of: carbon nanotube, nanowire, nanorod, nanosheet, carbon black (CB), graphitic fiber, diamond like carbon (DLC), and graphite platelet.

14. A method of positioning nanomaterials, comprising:
covering a substrate and a set of electrodes formed on the substrate with a single layer of guiding dielectric material;
patterning the single layer of guiding dielectric material to form dielectric guide features; and
producing an electric field by the set of electrodes, the electric field being attenuated by the dielectric guide features to create an attractive force that guides at least one nanostructure to a deposition surface of the substrate without positioning the at least one nanostructure directly atop the dielectric guide features.

15. The method of claim 14, further comprising forming the set of electrodes on the substrate, including:
forming a first mask on a surface of the substrate having openings for the set of electrodes;
blanket depositing an electrically conductive layer on the first mask, wherein the electrically conductive layer fills the openings; and
lifting the first mask.

16. The method of claim 15, wherein covering the substrate and the set of with the single layer of guiding dielectric material further includes using chemical vapor deposition.

17. The method of claim 14, wherein patterning the guiding dielectric material further includes performing photolithography and etch processes.

18. The method of claim 14, wherein the dielectric guide features include a dielectric material selected from the group consisting of: silicon oxide, silicon nitride, silicon oxynitride, aluminum oxide, hafnium oxide and combinations thereof.

19. The method of claim 14, wherein the at least one nanostructure includes a structure selected from the group consisting of: carbon nanotube, nanowire, nanorod, nanosheet, carbon black (CB), graphitic fiber, diamond like carbon (DLC), and graphite platelet.

20. The method of claim 14, wherein the at least one nanostructure is a single nanotube between each pair of dielectric guide features.

* * * * *